United States Patent
Ronis et al.

(10) Patent No.: US 11,333,718 B2
(45) Date of Patent: May 17, 2022

(54) SENSORS HAVING DYNAMIC PHASE COMPENSATION

(71) Applicant: Allegro MicroSystems, LLC, Manchester, NH (US)

(72) Inventors: Nicolás Ronis, Buenos Aires (AR); Franco Noel Martin Pirchio, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 198 days.

(21) Appl. No.: 16/849,179

(22) Filed: Apr. 15, 2020

(65) Prior Publication Data

US 2021/0325480 A1    Oct. 21, 2021

(51) Int. Cl.
G01R 33/00    (2006.01)
G01R 33/07    (2006.01)

(52) U.S. Cl.
CPC ......... *G01R 33/0017* (2013.01); *G01R 33/07* (2013.01)

(58) Field of Classification Search
CPC ....... G01R 33/07; G01R 33/09; G01R 33/075
See application file for complete search history.

(56) References Cited

U.S. PATENT DOCUMENTS

| | | |
|---|---|---|
| 5,619,137 A | 4/1997 | Vig et al. |
| 5,621,319 A | 4/1997 | Bilotti et al. |
| 5,781,005 A | 7/1998 | Vig et al. |
| 5,917,320 A | 6/1999 | Scheller et al. |
| 6,091,239 A | 7/2000 | Vig et al. |
| 6,278,269 B1 | 8/2001 | Vig et al. |
| 6,525,531 B2 | 2/2003 | Forrest et al. |
| 6,693,419 B2 | 2/2004 | Stauth et al. |
| 7,026,808 B2 | 4/2006 | Vig et al. |
| 7,253,614 B2 | 8/2007 | Forrest et al. |
| 7,368,904 B2 | 5/2008 | Scheller et al. |
| 7,425,821 B2 | 9/2008 | Monreal et al. |
| 7,605,647 B1 | 10/2009 | Romero et al. |
| 7,772,838 B2 | 8/2010 | Bailey et al. |
| 7,777,607 B2 | 8/2010 | Taylor et al. |
| 8,450,996 B2 | 5/2013 | Foletto et al. |
| 8,564,285 B2 | 10/2013 | Romero et al. |
| 8,624,588 B2 | 1/2014 | Vig et al. |
| 8,729,892 B2 | 5/2014 | Friedrich |
| 9,645,220 B2 | 5/2017 | Cesaretti et al. |
| 9,817,083 B2 | 11/2017 | Romero |

(Continued)

OTHER PUBLICATIONS

Huber et al., "A Fully Integrated Analog Compensation for the Piezo-Hall Effect in a CMOS Single-Chip Hall Sensor Microsystem;" Article in IEEE Sensors Journal, vol. 15, No. 5; May 2015; 10 Pages.

(Continued)

*Primary Examiner* — Alvaro E Fortich
(74) *Attorney, Agent, or Firm* — Daly Crowley Mofford & Durkee, LLP

(57) ABSTRACT

Methods and apparatus for a magnetic field sensor having dynamic offset compensation that determines offset voltages for a number of phases each having a bias current across a magnetic field sensing element in a different direction. Pairs of the determined offset voltages for the phases are combined and one of the combined pairs of offset voltages is selected based on a criteria, such as lowest voltage level.

24 Claims, 9 Drawing Sheets

(56) References Cited

U.S. PATENT DOCUMENTS

| | | | |
|---|---|---|---|
| 10,270,428 | B1 | 4/2019 | Geisler et al. |
| 10,444,299 | B2 | 10/2019 | Romero et al. |
| 10,481,219 | B2 | 11/2019 | Romero et al. |
| 2012/0249126 | A1 | 10/2012 | Friedrich et al. |
| 2013/0015853 | A1 | 1/2013 | Raz et al. |
| 2013/0214774 | A1* | 8/2013 | Cesaretti ............ G01R 33/0041 324/251 |
| 2014/0210462 | A1* | 7/2014 | Yamamoto ............. G01R 33/07 324/251 |
| 2015/0301149 | A1* | 10/2015 | Cesaretti ............. G01R 33/075 324/202 |
| 2016/0047864 | A1* | 2/2016 | Nishimura ............. G01R 33/07 324/225 |
| 2018/0372809 | A1* | 12/2018 | Angelini ............ G01R 33/0017 |
| 2019/0079146 | A1* | 3/2019 | Romero .................. H03M 1/00 |
| 2019/0302196 | A1* | 10/2019 | Cook ................. G01R 33/0029 |

OTHER PUBLICATIONS

Huber et al., "Package Stress Monitor to Compensate for the Piezo-Hall Effect in CMOS Hall Sensors;" Article in IEEE Sensors Journal, vol. 13, No. 8; Aug. 2013; 4 Pages.

U.S. Appl. No. 17/130,161, filed Dec. 22, 2020, Rubinsztain et al.

\* cited by examiner

SENSORS HAVING DYNAMIC PHASE COMPENSATION

BACKGROUND

Magnetic field sensors, which use magnetic field sensing elements, are used in a variety of applications, including, but not limited to, a current sensor that senses a magnetic field generated by a current carried by a current-carrying conductor, a magnetic switch, a proximity detector that senses the proximity of a ferromagnetic or magnetic object, a rotation detector that senses passing ferromagnetic articles, for example, gear teeth, and a magnetic field sensor that senses a strength or density of a magnetic field.

It is known that Hall Effect elements exhibit an undesirable DC offset voltage. Techniques have been developed to reduce the DC offset voltage, while still allowing the Hall Effect element to sense a magnetic field. One such technique is commonly referred to as "chopping" or "current spinning" and entails driving a Hall Effect element in two or more different directions and receiving output signals at different output terminals as the Hall Effect element is driven. In this way, selected drive and signal contact pairs are interchanged during each phase of the chopping and offset voltages of the different driving arrangements tend to cancel.

Chopping is also a well-known technique applied to amplifiers to reduce an offset component and low frequency noise (i.e., flicker noise) of signals applied to the amplifier. Amplifiers implementing chopping are often referred to as chopper stabilized amplifiers.

SUMMARY

In one aspect, a method comprises: determining offset voltages for a number of phases each having a bias current across a magnetic field sensing element in a different direction; combining pairs of the determined offset voltages for the phases; and identifying one of the combined pairs of offset voltages based on a criteria.

A method can further include one or more of the following features: the criteria comprises lowest voltage level, the bias currents are equally spaced apart in direction, the combined pairs have orthogonal bias currents, the magnetic field sensing element comprises a Hall element, controlling a first set of switches coupled to the magnetic field sensing element to select each of the phases, controlling a switch matrix to perform the combining pairs of the determined offset voltages for the phases, sampling and holding voltages of the combined pairs of the determined offset voltages for the phases, and/or operating a sensor at 2× chopping after identifying the one of the combined pairs of offset voltages based on the criteria, and/or In another aspect, a sensor comprises: an offset comparison module configured to: determine offset voltages for a number of phases each having a bias current across a magnetic field sensing element in a different direction; combine pairs of the determined offset voltages for the phases; and identify one of the combined pairs of offset voltages based on a criteria.

A sensor can further include one or more of the following features: the criteria comprises lowest voltage level, the bias currents are equally spaced apart in direction, the combined pairs have orthogonal bias currents, the magnetic field sensing element comprises a Hall element, a first set of switches coupled to the magnetic field sensing element to select each of the phases, a switch matrix to combine the pairs of the determined offset voltages for the phases, the offset comparison module is further configured to sample and hold voltages of the combined pairs of the determined offset voltages for the phases, and/or the sensor is configured to operate at 2× chopping after identifying the one of the combined pairs of offset voltages based on the criteria.

In a further aspect, a sensor comprises: a magnetic field sensing element; and an offset comparison means for determining offset voltages for a number of phases each having a bias current across the magnetic field sensing element in a different direction, combining pairs of the determined offset voltages for the phases; and identifying one of the combined pairs of offset voltages based on a criteria.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
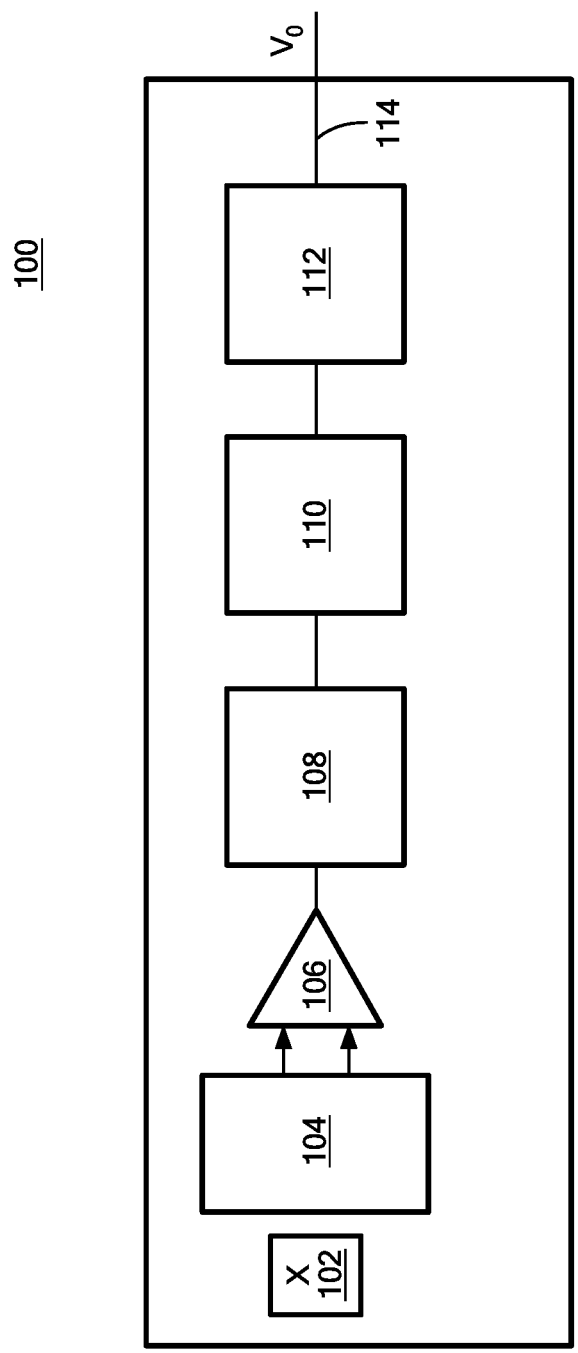
FIG. 1 is a high-level block diagram of an example sensor system having dynamic voltage offset compensation in accordance with example embodiments of the invention.

FIG. 1 shows an example sensor system 100 having dynamic signal chopping for reducing offset voltage effects in accordance with example embodiments of the invention. In the illustrated embodiment, the sensor system 100 is configured to detect motion characteristics of a target. The sensor system 100, which can be provided in an integrated circuit (IC) package, includes a magnetic field sensing element 102, which is provided as a Hall element in the illustrated embodiment. The magnetic field sensing element 102 is coupled to a dynamic offset cancellation module 104 for reducing offset voltages. The output of the dynamic offset cancellation module 104 is amplified 106 and filtered, such as by a low pass filter (LPF) 108, and provided to a sample and hold module 110. The output of the sample and hold module 110 is connected to an output module 112 which outputs a sensor output signal 114.

In embodiments, the sensor system 100 collects signals for various chopping phase combinations for the magnetic field sensing element(s) 102. In one embodiment, the phase combination having the lowest offset voltage can be selected to increase throughput of the sensor, as described more fully below. In one particular embodiment, the sensor 100 dynamically detects the two-times orthogonal chopping phase combination that exhibits the smallest Hall Plate offset to increase output throughput while maintaining good offset cancellation performance.

Figure 2:
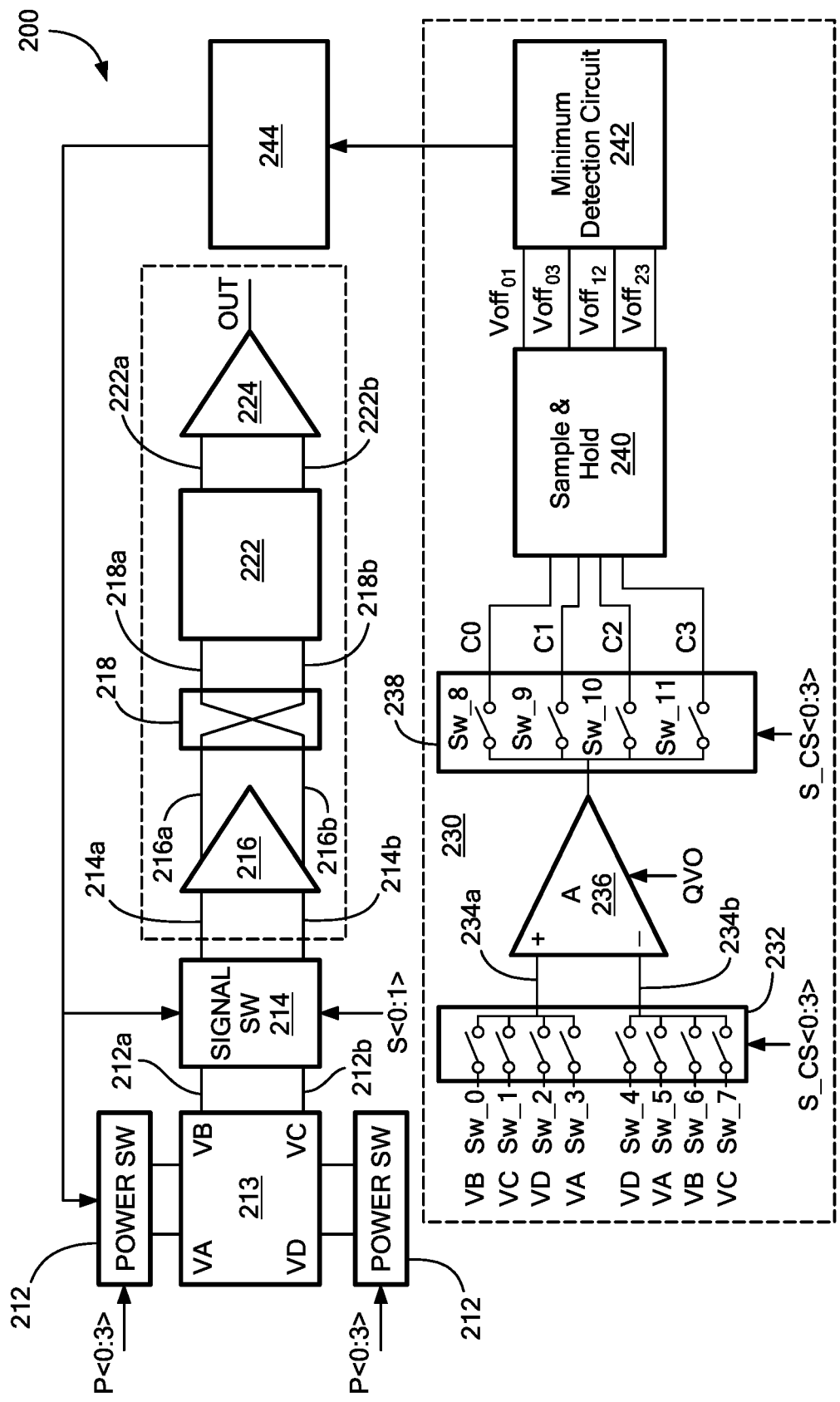
FIG. 2 is a schematic representation of the sensor system of FIG. 1.

FIG. 2 shows an example magnetic field sensor 200 having offset voltage processing in accordance with embodiments. The sensor 200 includes a Hall effect element 213 coupled within a first switching circuit 212. The first switching circuit 212 is configured to generate differential output signals 212a, 212b responsive to an external magnetic field. Certain signals described below can be differential signals, however, the term differential is not used in all instances. In other embodiments, some or all of the signals may be single ended signals. The first switching circuit 212 is more fully described below in conjunction with FIG. 2A. Let it suffice here to say that the first switching circuit 212 switches a bias/drive signal (not shown) to the Hall effect element 213 with a clock at a frequency of $f_c$.

The magnetic field sensor 200 also includes a second switching circuit 214 coupled to receive the output signals 212a, 212b and configured to generate chopped signals 214a, 214b. The second switching circuit 214 is also switched with the clock at a frequency of $f_c$. Combined operation of the first switching circuit 212 with the second switching circuit 214 is described more fully below.

An amplifier 216 is configured to receive the chopped signals 214a, 214b and generate an amplified signal 216a, 216 b. A third switching circuit 218 is coupled to receive the amplified signals 216a, 216b and generate demultiplexed signals 218a, 218b. The third switching circuit 218 is clocked with the clock at the frequency, $f_c$ the output of which can be low pass filtered. In example embodiments, a sin x/x (sinc) filter 222 is coupled to receive the filtered signals 218a,b from the third switching circuit 218 and configured to generate a filtered signal 222 a, 222 b, which can be output from an output module 224.

In some embodiments, the sine filter 222 comprises a switched capacitor filter having a first notch at a frequency $f_c$. However, in other embodiments, the sine filter 222 is generated digitally. In still other embodiments, the sine filter 222 comprises an analog unclocked filter.

It will be understood that clock frequency provided to the sine filter 222 can be at a frequency of $f_c$ as shown to provide the notch at the frequency $f_c$. However, it will also be understood that the sine filter 222 can be designed to have the notch at the frequency $f_c$ but using a clock signal at a different frequency.

It will be understood that the magnetic field sensor output signals may comprise a linear signal proportional to a magnetic field experience by the magnetic field sensing element 213 and that the magnetic field sensor 200 comprises a linear magnetic field sensor. However, in other embodiments, a comparator can receive the output signal. The magnetic field sensor output signal thus generated by the comparator may be a two-state signal, and the magnetic field sensor may comprise a magnetic switch.

An offset comparison module 230 can include a first switch matrix 232 with a series of switches, shown as Sw0-7 in the illustrated embodiment, that can be coupled to the terminals/voltages VA, VB, VC, VD of the magnetic field sensing element 213.

The offset comparison module 230 obtains the offset values from orthogonal combinations, compares them, and modifies the power and signal switches 212, 214 so that the signal path uses a desired 2× chopping arrangement. The amplifier 236 samples and amplifies the Hall Plate signals to facilitate processing and comparison of signals.

The voltages 234a,b selected by the switches Sw0-7 are amplified 236 and input to a second switch matrix 238 having a series of switches Sw8-11 that provide a selected signal C0, C1, C2 or C3 to a sample and hold circuit 240. A minimum detection module 242 receives signals from the sample and hold circuit 240 and identifies a preferred, e.g., lowest, offset voltage. The minimum detection module 242 outputs control signals to the power switches 212 and signal switches 214 via a switch control circuit 244 for controlling the dynamic offset. 2A shows example phases 0, 1, 2, and 3 based on the configuration of the switches in the first and second switching circuits 212, 214 that connect each of the first terminal 250, second terminal 252, third terminal 254, and fourth terminal 256 of the Hall plate 213 that generate a bias current 258 having the illustrated direction. In phase 0, the first terminal 250 of the Hall plate is coupled to Vcc and the third terminal 254 is coupled to ground to bias the Hall plate with the bias current in a first direction 213 across the Hall plate. The second terminal 252 and the fourth terminal 256 provide differential output signals from the Hall plate to the first amplifier 216 (FIG. 2). The differential output signals from the Hall plate on the second and fourth terminals 252, 256 is $V_H+Voff_0$. It is understood that the illustrative results consider the magnetic field entering the plane as shown with the cross labeled with a B in the top right FIG. 2A.

In phase 1, the switches in the first and second switch circuits 212, 214 are configured to connect the second terminal 252 to Vcc and the fourth terminal 256 to ground. A Hall output voltage of $V_H+V_{Off1}$ is generated across the first and third terminals 250, 254. The bias current 258 is generated across the Hall element as shown.

In phase 2, the switches in the first and second switch circuits 212, 214 are configured to connect the third terminal 254 to Vcc and the first terminal 250 to ground. A Hall output voltage of $V_H+V_{off2}$ is generated across the second and fourth terminals 252, 256. The bias current 258 is generated across the Hall element as shown.

In phase 3, the switches in the first and second switch circuits 212, 214 are configured to connect the fourth terminal 256 to Vcc and the second terminal 252 to ground. A Hall output voltage of $V_H+V_{off3}$ is generated across the first and third terminals 250, 254. The bias current 258 is generated across the Hall element as shown.

As can be seen, in Phase 0, the voltage at the output of the Hall Plate is $V_H+V_{off0}$ where in Phase 1 we have $V_H+V_{off1}$. Considering that $V_{off0}=-V_{off1}$, averaging both voltages (called 2× chopping) will eliminate the offset, as set forth below:

$$V_H=(V_H+V_{off0}+V_H+V_{off1})/2=(2V_H)/2$$

In practical implementations, perfect offset cancellation may not be possible, so that a residual offset is present. To further reduce the residual offset, the orthogonal phase combinations are used, as described above, to spin the current in possible directions (called 4× chopping). A drawback of conventional 4× chopping is that a complete cycle of four clocks are needed to select the desired output.

As described herein, embodiments can select a 2× orthogonal chopping combination among four possibilities (e.g., Phase 0 with Phase 1, Phase 0 with Phase 3, Phase 1 with Phase 2 or Phase 2 with Phase 3) that provides the lowest voltage offset. With this arrangement, a sensor can operate at about 2× chopping speed with the lowest offset.

Figure 2A:
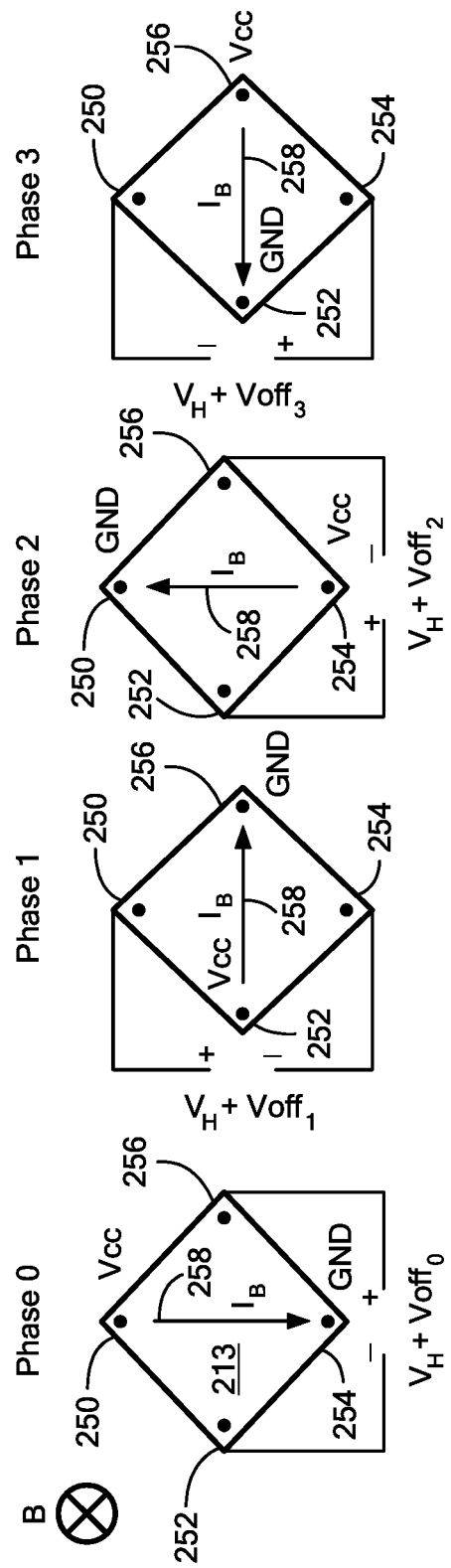
FIG. 2A is a schematic representation of different phases having different bias currents for a magnetic field sensing element.

The power switches 212 (see P0-3 of FIG. control the switches coupled to the Hall element 213 for the various phases shown in FIG. 2A, which shows phase 0, 1, 2, and 3 each having different offset voltages. The power switches P0-3 rotate the Hall Plate bias current where the signal switches 214 (see S0-1 of FIG. 3) rotate the contacts in which the signal is taken. For example, in Phase 0 the power switches connect contacts Hall contact VA to VCC and contact VC to ground so that the bias current IB flows between them and the signal switches 214 connect contacts VB and VD where the Hall 213 voltage is measured. In Phase 1, the power switches 212 connect contacts VB to VCC and VD to ground and the signal switches 214 connect VA and VC. The select signals S0,1 of the signal switches 214 control which outputs from the Hall element 213 are input to which inputs of the amplifier 216.

The signals S_CS0-3) control which of the signals VA, VB, VC, VD from the Hall element 213 are provided to the amplifier 236 and which phase combination is provided to the sample and hold circuit 240. Table 1 below shows signal, switch setting, and sampled voltage signal for various phases.

TABLE 1

| Signal | Closed Switches | Sample and Hold Input |
|---|---|---|
| S_CS<0> | Sw_0, Sw_4, Sw_8 | VC0 = Av · (VH + Voff0 + VoffAMP + QVO) |
| S_CS<1> | Sw_1, Sw_5, Sw_9 | VC1 = Av · (VH + Voff1 + VoffAMP + QVO) |
| S_CS<2> | Sw_2, Sw_6, Sw_10 | VC2 = Av · (VH + Voff2 + VoffAMP + QVO) |
| S_CS<3> | Sw_3, Sw_7, Sw_11 | VC3 = Av · (VH + Voff3 + VoffAMP + QVO) |

For the sample input and hold inputs, Av is the gain of the OpAmp 236, $V_H$ is the Hall Plate voltage, Voffx is the offset voltage of the phase x, VoffAMP and QVO are the offset and the quiescent output voltage of the amplifier 236 respectively.

Since, as shown above, orthogonal directions have offsets with opposite sign, the sample and hold module 240 calculates the difference between the voltage sampled in its internal capacitors as follows:

$$V_{off01} = V_{c0} - V_{c1} = Av \cdot (V_{off0} - V_{off1}) \quad \text{Combination Phase 0 and Phase 1:}$$

$$V_{off03} = V_{c0} - V_{c3} = Av \cdot (V_{off0} - V_{off3}) \quad \text{Combination Phase 0 and Phase 3:}$$

$$V_{off12} = V_{c1} - V_{c2} = Av \cdot (V_{off1} - V_{off2}) \quad \text{Combination Phase 1 and Phase 2:}$$

$$V_{off23} = V_{c2} - V_{c3} = Av \cdot (V_{off2} - V_{off3}) \quad \text{Combination Phase 2 and Phase 3:}$$

Each of the sample and hold 240 output voltages $V_{off01}$, $V_{off03}$, $V_{off12}$, $V_{off23}$ defined above are provided to the minimum detection module 242 for selecting a desired, e.g., lowest, offset voltage. In embodiments, the minimum detection module 242 determines the phase combination that presents the minimum offset value. Using that information, the circuit 244 controls the power and signal switches 212, 214 for operating in a 2× chopping mode. In embodiments, there is an initial 4× chopping cycle during start-up for selecting the desired phase combination selection.

Figure 3A:
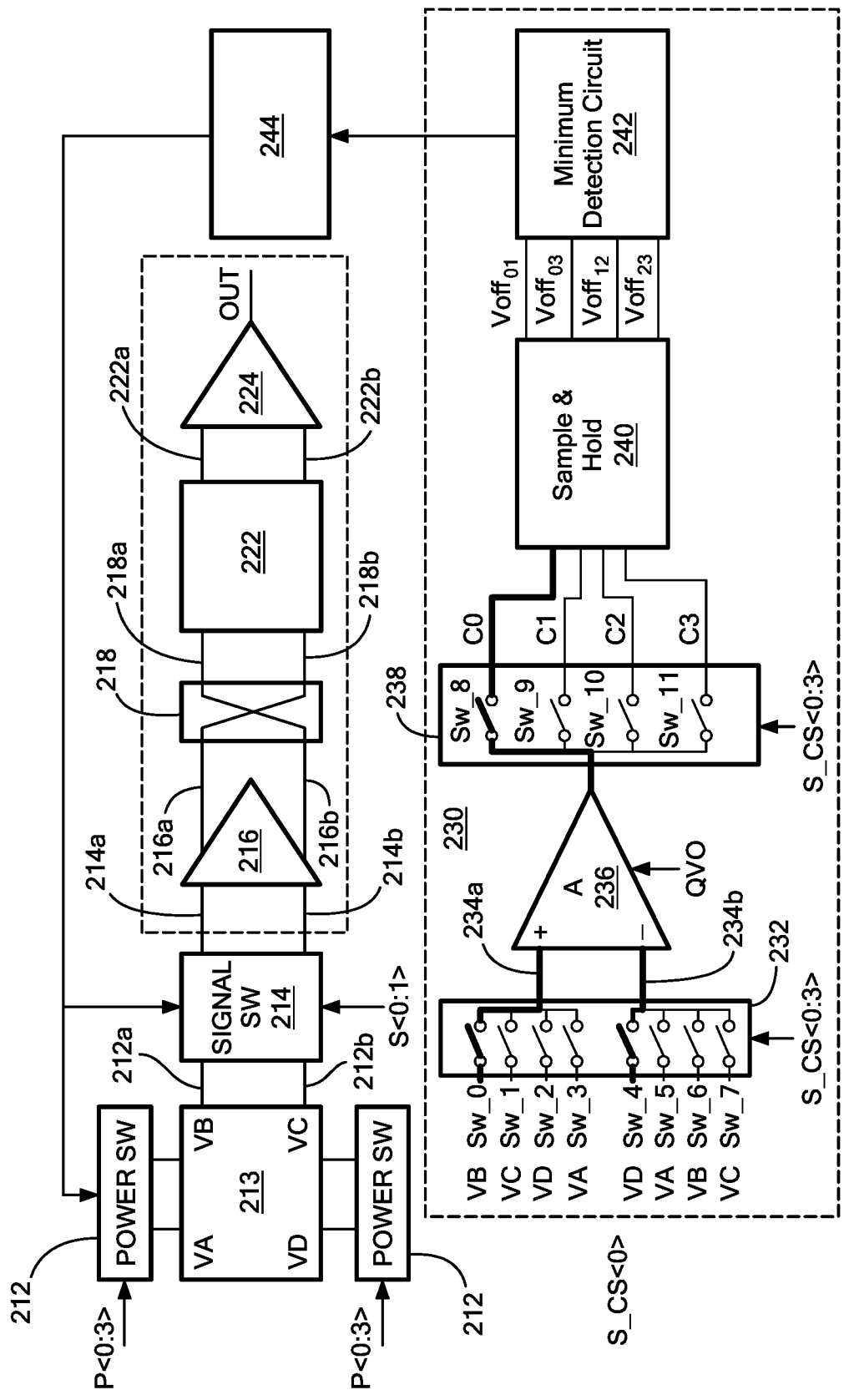
FIGS. 3A-D show respective signal paths controlled by switches in the system of FIG. 2.
Figure 3B:
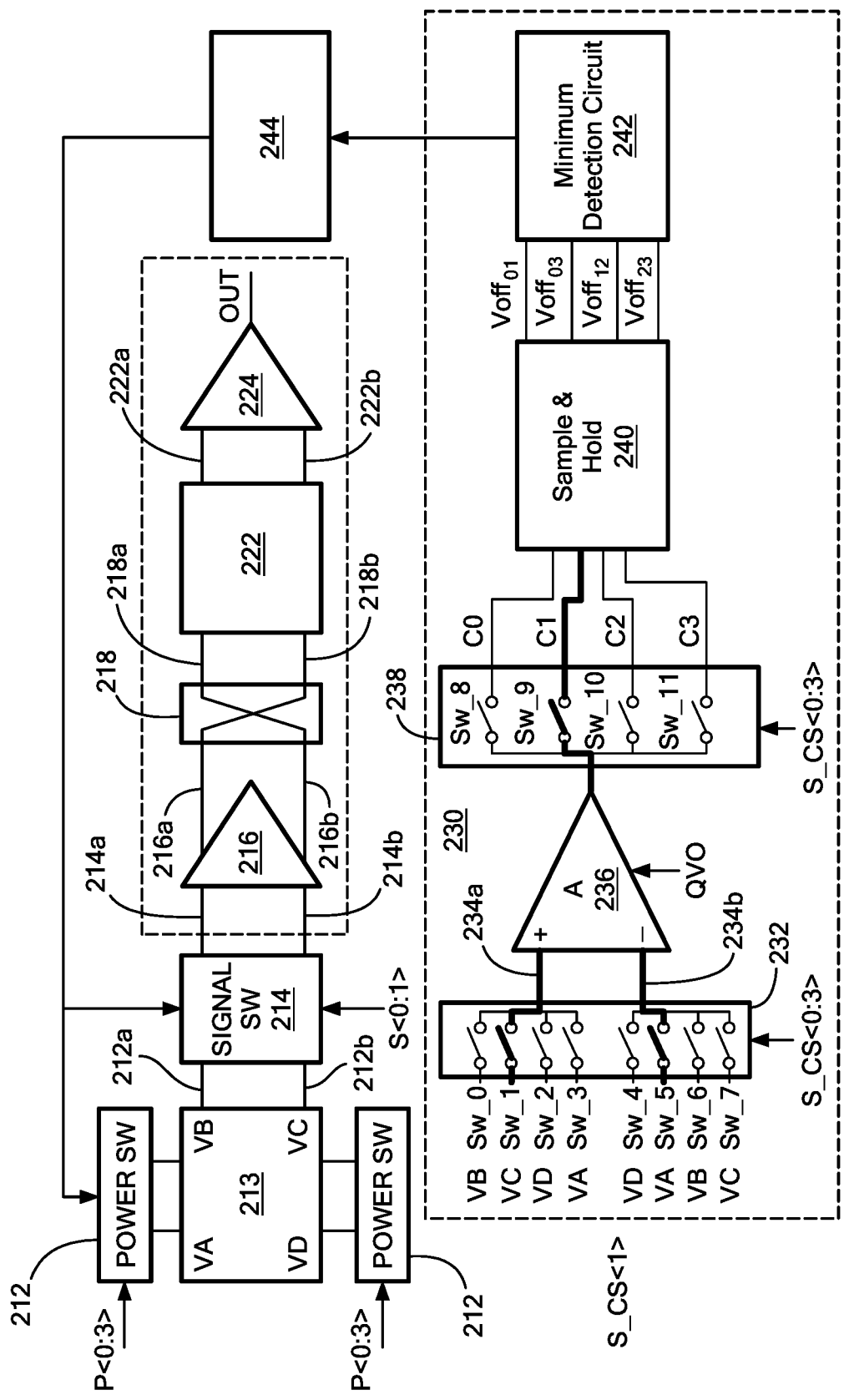
Figure 3C:
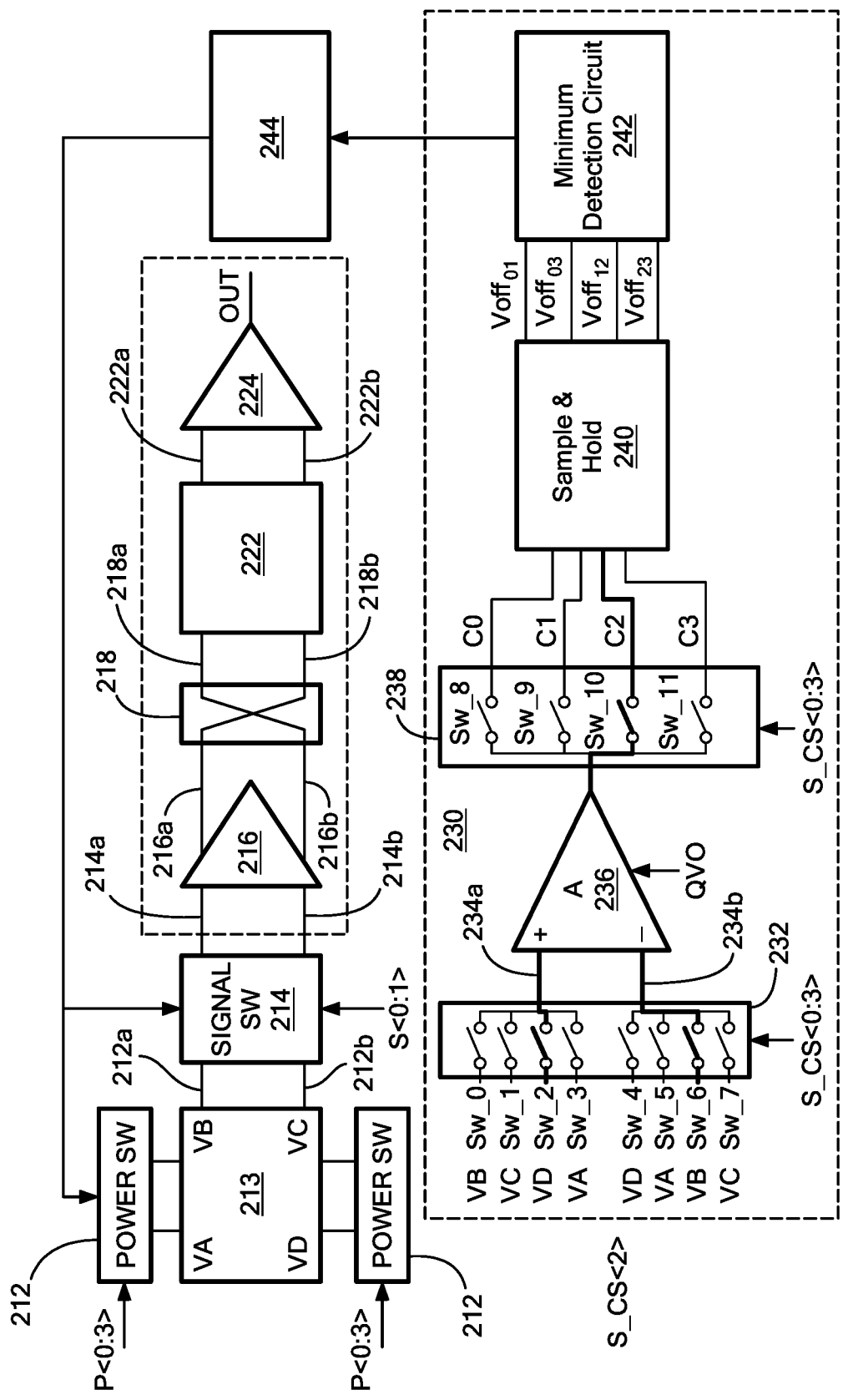
Figure 3D:
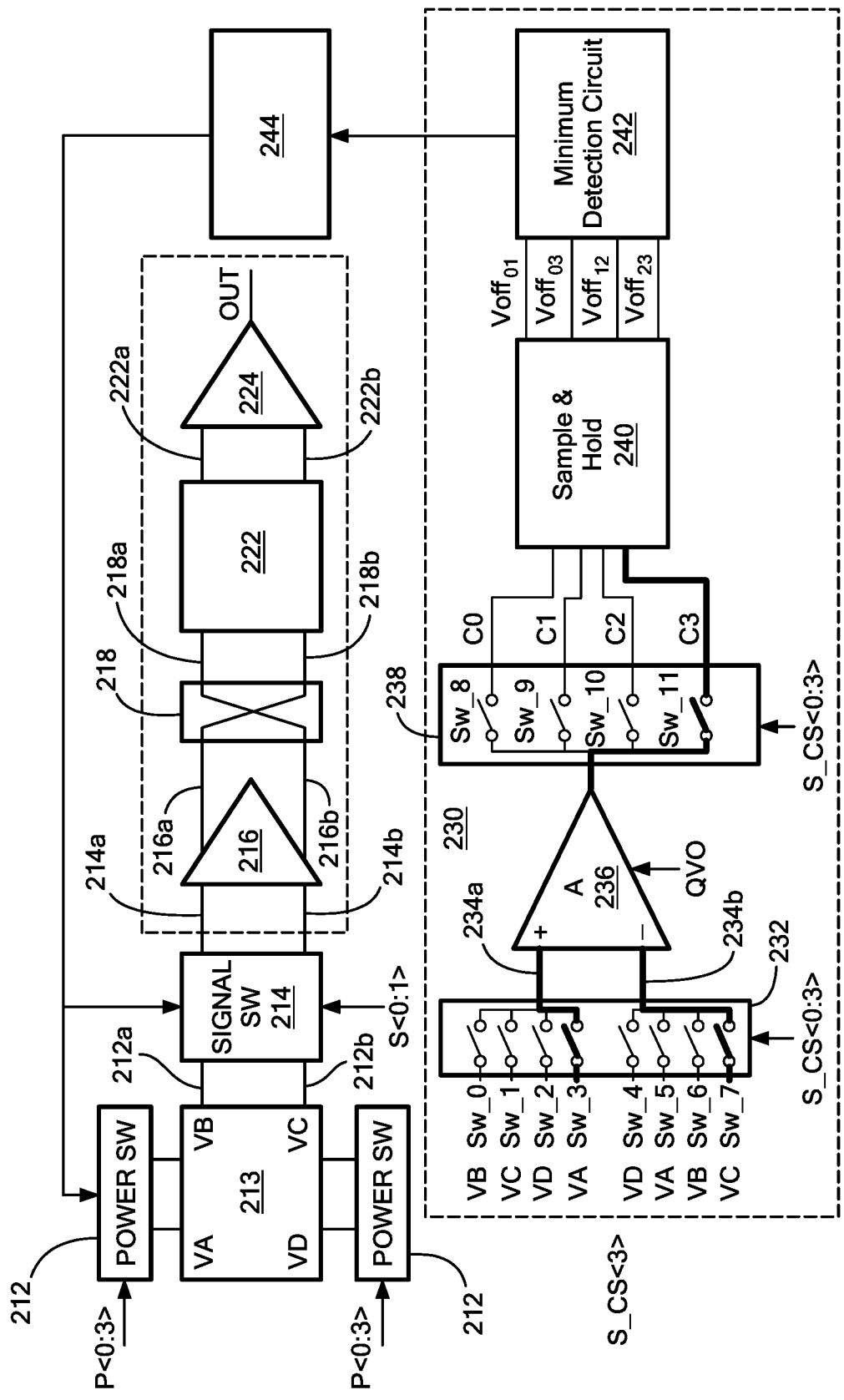

FIGS. 3A-D show the signal paths for signals S_CS0-3 in Table 1. FIG. 3A shows the switch positions for S_CS0, FIG. 3B shows the switch positions for S_CS1, FIG. 3C shows the switch positions for S_CS2, and FIG. 3D shows the switch positions for S_CS3. As can be seen, switches Sw0-11 determine which Hall signals are selected and which phase combination is provided to the sample and hold module 240 for processing to select a desired phase combination.

It should be noted that illustrative offset comparison refresh does not need to be instantaneous. The parameters that affect the offset move slowly over time, so the system can use several clock cycles to select a phase combination. Furthermore, using the same path to analyze each phase guarantees that any non-idealities of the system affects all phases evenly.

Figure 4:
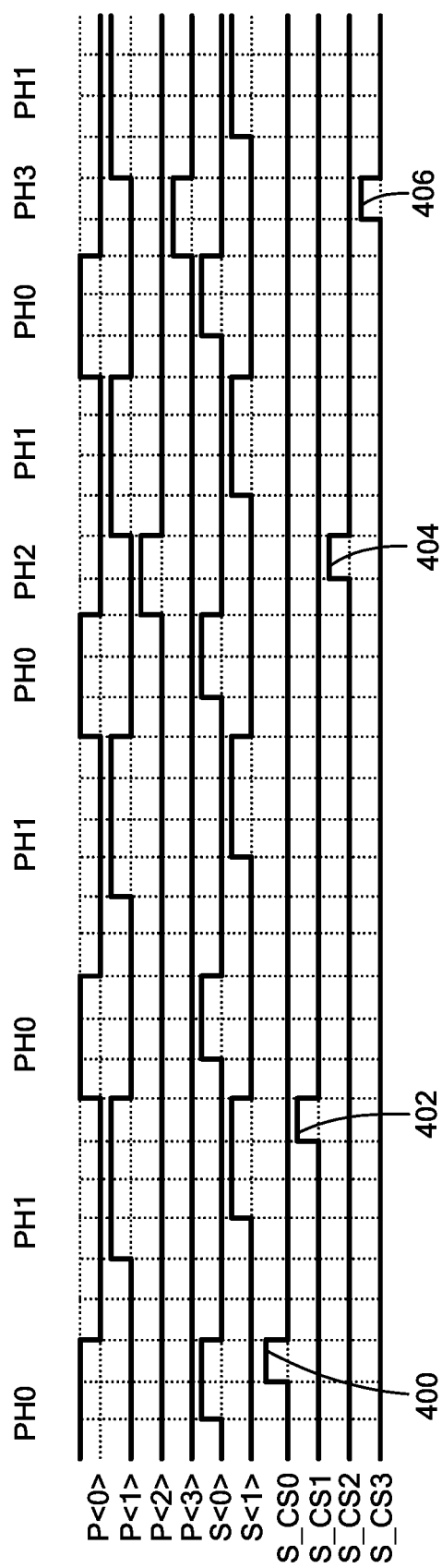
FIG. 4 is a timing diagram of signals to effect the respective signal paths of FIGS. 3A-D.

FIG. 4, in conjunction with FIG. 2, shows example waveforms for phases PH0-3 of the power switches P0, P1, P2, P3, the switches S0, S1 of the first select switches 214 to select the polarity of the signals 214a,b to the amplifier 216, and the signals S_CS0-3 for controlling the switches in matrix 232 and 238 to sample the voltages of the phase combinations. FIG. 4 shows an example timing diagram in which Phase 0 and Phase 1 are used as the combination having the lowest offset.

In the example embodiment, S_CS0 of Table 1 above is indicated by a first pulse 400. S_CS1 is indicated by a second pulse 402, S_CS2 is indicated by a third puke 404, and S_CS3 is indicated by fourth pulse 406. Table 1 shows the switch positions for listed phase combinations.

The example embodiments shown and described above provide almost double the throughput of a conventional sensor chopping scheme that cycle through four chopping phases. In addition, example embodiments having two phase chopping generate less ripple than the combinations of four phase Hall Plate chopping and two-time sinc filter sliding, as in some conventional sensors. Also, example embodiments need less dynamic range in operation that some conventional sensors and can increase signal-to-offset ratio.

Embodiments of dynamic offset compensation are applicable to a wide variety of magnetic field sensors in which voltage offset reduction is desirable. Example sensor types include latches, speed sensors, position sensors, angle sensors, and the like.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "accuracy," when referring to a magnetic field sensor, is used to refer to a variety of aspects of the magnetic field sensor. These aspects include, but are not limited to, an ability of the magnetic field sensor to differentiate: a gear tooth from a gear valley (or, more generally, the presence of a ferromagnetic object from the absence of a ferromagnetic object) when the gear is not rotating and/or when the gear is rotating (or, more generally, when a ferromagnetic object is moving or not moving), an ability to differentiate an edge of a tooth of the gear from the tooth or the valley of the gear (or, more generally, the edge of a ferromagnetic object or a change in magnetization direction of a hard ferromagnetic object), and a rotational accuracy with which the edge of the gear tooth is identified (or, more generally, the positional accuracy with which an edge of a ferromagnetic object or hard ferromagnetic object can be identified). Ultimately, accuracy refers to output signal edge placement accuracy and consistency with respect to gear tooth edges passing by the magnetic field sensor.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

It is desirable for magnetic field sensors to achieve a certain level or amount of accuracy even in the presence of variations in an air gap between the magnetic field sensor and the gear that may change from installation to installation or from time to time. It is also desirable for magnetic field sensors to achieve accuracy even in the presence of variations in relative positions of the magnet and the magnetic field sensing element within the magnetic field sensor. It is also desirable for magnetic field sensors to achieve accuracy even in the presence of unit-to-unit variations in the magnetic field generated by a magnet within the magnetic field sensors. It is also desirable for magnetic field sensors to achieve accuracy even in the presence of variations of an axial rotation of the magnetic field sensors relative to the gear. It is also desirable for magnetic field sensors to achieve accuracy even in the presence of temperature variations of the magnetic field sensors.

Example magnetic field sensors can have a variety of features that may be described in one or more of the following patents or patent publications: U.S. Pat. Nos. 6,525,531, 6,278,269, 5,781,005, 7,777,607, 8,450,996, 7,772,838, 7,253,614, 7,026,808, 8,624,588, 7,368,904, 6,693,419, 8,729,892, 5,917,320, 6,091,239, 2012/0249126, all of which are herein incorporated herein by reference.

Figure 5:
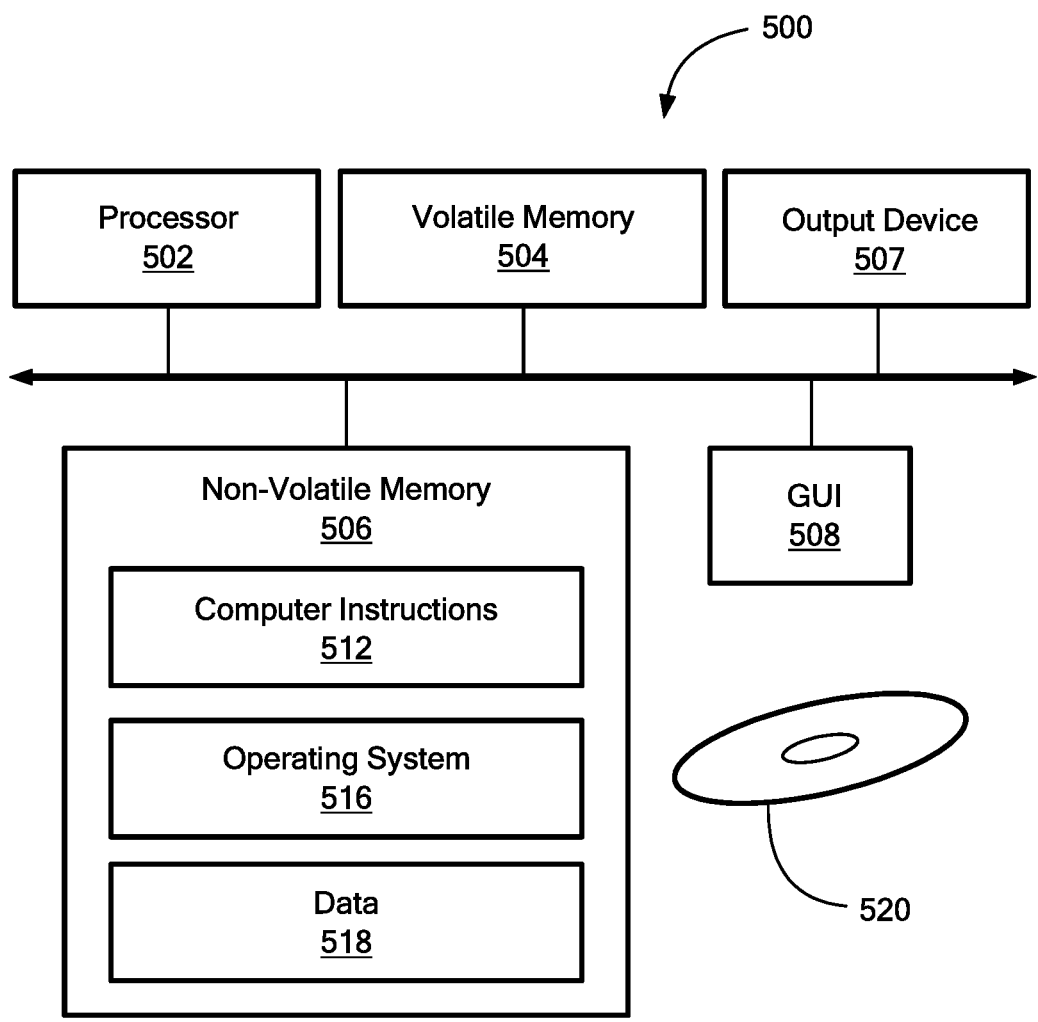
FIG. 5 is a schematic representation of an example computer that can perform at least a portion of the processing described herein.

FIG. 5 shows an exemplary computer 500 that can perform at least part of the processing described herein, such as switch control, sample and hold, and/or minimum detection processing. The computer 500 includes a processor 502, a volatile memory 504, a non-volatile memory 506 (e.g., hard disk), an output device 507 and a graphical user interface (GUI) 508 (e.g., a mouse, a keyboard, a display, for example). The non-volatile memory 506 stores computer instructions 512, an operating system 516 and data 518. In one example, the computer instructions 512 are executed by the processor 502 out of volatile memory 504. In one embodiment, an article 520 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
  determining offset voltages for a number of phases each having a bias current across a magnetic field sensing element in a different direction;
  combining pairs of the determined offset voltages for the phases;

identifying one of the combined pairs having a lowest one of the offset voltages; and selecting the one of the combined pairs having the lowest offset voltages for signal chopping in a magnetic sensor.

2. The method according to claim 1, wherein the bias currents are equally spaced apart in direction.

3. The method according to claim 1, wherein the combined pairs have orthogonal bias currents.

4. The method according to claim 1, wherein the magnetic field sensing element comprises a Hall element.

5. The method according to claim 1, further including controlling a first set of switches coupled to the magnetic field sensing element to select each of the phases.

6. The method according to claim 1, further including controlling a switch matrix to perform the combining pairs of the determined offset voltages for the phases.

7. The method according to claim 6, further including sampling and holding voltages of the combined pairs of the determined offset voltages for the phases.

8. The method according to claim 1, further including operating a sensor at 2× chopping after identifying the one of the combined pairs of offset voltages based on the criteria.

9. A sensor, comprising:
an offset comparison module configured to:
determine offset voltages for a number of phases each having a bias current across a magnetic field sensing element in a different direction;
combine pairs of the determined offset voltages for the phases; and
identify one of the combined pairs having a lowest one of the offset voltages; and
select the one of the combined pairs having the lowest offset voltages for signal chopping in a magnetic sensor.

10. The sensor according to claim 9, wherein the bias currents are equally spaced apart in direction.

11. The sensor according to claim 9, wherein the combined pairs have orthogonal bias currents.

12. The sensor according to claim 9, wherein the magnetic field sensing element comprises a Hall element.

13. The sensor according to claim 9, further including a first set of switches coupled to the magnetic field sensing element to select each of the phases.

14. The sensor according to claim 9, further including a switch matrix to combine the pairs of the determined offset voltages for the phases.

15. The sensor according to claim 14, wherein the offset comparison module is further configured to sample and hold voltages of the combined pairs of the determined offset voltages for the phases.

16. The sensor according to claim 9, wherein the sensor is configured to operate at 2× chopping after identifying the one of the combined pairs of offset voltages based on the criteria.

17. A sensor, comprising:
a magnetic field sensing element; and
an offset comparison means for determining offset voltages for a number of phases each having a bias current across the magnetic field sensing element in a different direction, combining pairs of the determined offset voltages for the phases; and, identifying one of the combined pairs having a lowest one of the offset voltages; and selecting the one of the combined pairs having the lowest offset voltages for signal chopping in a magnetic sensor.

18. The sensor according to claim 17, wherein the bias currents are equally spaced apart in direction.

19. The sensor according to claim 17, wherein the combined pairs have orthogonal bias currents.

20. The sensor according to claim 17, wherein the magnetic field sensing element comprises a Hall element.

21. The sensor according to claim 17, further including a first set of switches coupled to the magnetic field sensing element to select each of the phases.

22. The sensor according to claim 17, further including a switch matrix means for combining the pairs of the determined offset voltages for the phases.

23. The sensor according to claim 22, wherein the offset comparison means samples and holds voltages of the combined pairs of the determined offset voltages for the phases.

24. The sensor according to claim 17, wherein the sensor is configured to operate at 2× chopping after identifying the one of the combined pairs of offset voltages based on the criteria.

* * * * *